US012082361B2

(12) United States Patent
Ezaki

(10) Patent No.: US 12,082,361 B2
(45) Date of Patent: Sep. 3, 2024

(54) ELECTRONIC DEVICE

(71) Applicant: OMRON Corporation, Kyoto (JP)

(72) Inventor: Shinji Ezaki, Yamatokoriyama (JP)

(73) Assignee: OMRON CORPORATION, Kyoto (JP)

( * ) Notice: Subject to any disclaimer, the term of this patent is extended or adjusted under 35 U.S.C. 154(b) by 468 days.

(21) Appl. No.: 17/595,784

(22) PCT Filed: Feb. 5, 2020

(86) PCT No.: PCT/JP2020/004341
§ 371 (c)(1),
(2) Date: Nov. 24, 2021

(87) PCT Pub. No.: WO2020/246068
PCT Pub. Date: Dec. 10, 2020

(65) Prior Publication Data
US 2022/0225525 A1   Jul. 14, 2022

(30) Foreign Application Priority Data
Jun. 6, 2019   (JP) ................................ 2019-105889

(51) Int. Cl.
*H05K 7/14*   (2006.01)
*H05K 1/14*   (2006.01)
(52) U.S. Cl.
CPC .............. *H05K 7/1427* (2013.01); *H05K 1/14* (2013.01); *H05K 1/144* (2013.01); *H05K 7/1417* (2013.01); *H05K 2201/042* (2013.01)
(58) Field of Classification Search
CPC ...... H05K 7/1427; H05K 7/1417; H05K 1/14; H05K 1/144; H05K 2201/042
(Continued)

(56) References Cited

U.S. PATENT DOCUMENTS 5,438,482 A * 8/1995 Nakamura ........... H05K 7/1417
174/371
5,844,781 A * 12/1998 Schlotterer ............ H05K 5/062
361/752

(Continued)

FOREIGN PATENT DOCUMENTS

CN         103444272 A    12/2013
JP         3-12484 U      2/1991
(Continued)

OTHER PUBLICATIONS

International Search Report for PCT/JP2020/004341 dated Apr. 14, 2020 (PCT/ISA/210).
(Continued)

*Primary Examiner* — Zhengfu J Feng
(74) *Attorney, Agent, or Firm* — Sughrue Mion, PLLC

(57) ABSTRACT

An electronic device includes a housing, first and second wiring substrates disposed to face each other, a fixing member that is made of an electrically conductive member and fixes the first and second wiring substrates to each other, and an external connection terminal provided in the housing. The fixing member has first and second fixing portions, and is interposed between the first and second wiring substrates. The fixing member is electrically conductive to a first electrically conductive portion provided in the first wiring substrate by fixing the first fixing portion to the first wiring substrate. The fixing member is electrically conductive to a second electrically conductive portion provided in the second wiring substrate by fixing the second fixing portion to the second wiring substrate. The external connection terminal is electrically conductive to the fixing member by electrically connecting the fixing member to the external connection terminal.

8 Claims, 7 Drawing Sheets

(58) Field of Classification Search
USPC .......................................................... 361/759
See application file for complete search history.

(56) References Cited

U.S. PATENT DOCUMENTS

| 11,382,230 B2* | 7/2022 | Fujiwara .............. H05K 7/2039 |
| 2008/0305687 A1 | 12/2008 | Zhang et al. |
| 2017/0373411 A1 | 12/2017 | Yokoo |

FOREIGN PATENT DOCUMENTS

| JP | 04-103676 U | | 9/1992 |
| JP | 4-309292 A | | 10/1992 |
| JP | 7-045982 A | | 2/1995 |
| JP | 9-018181 A | | 1/1997 |
| JP | H0918181 A | * | 1/1997 |
| JP | 2003-133762 A | | 5/2003 |
| JP | 2006-222341 A | | 8/2006 |
| JP | 2007165628 A | * | 6/2007 |
| JP | 2008199068 A | | 8/2008 |
| JP | 2014-160378 A | | 9/2014 |
| JP | 2017-227536 A | | 12/2017 |

OTHER PUBLICATIONS

Written Opinion for PCT/JP2020/004341 dated Apr. 14, 2020 (PCT/ISA/237).
Extended European Search Report dated May 25, 2023 in Application No. 20819203.9.
Office Action issued Oct. 20, 2023 in Korean Application No. 10-2021-7037676.
Office Action Jul. 9, 2024 issued in Chinese Application No. 202080039031.1.

* cited by examiner

ELECTRONIC DEVICE

CROSS REFERENCE TO RELATED APPLICATIONS

This application is a National Stage of International Application No. PCT/JP2020/004341 filed Feb. 5, 2020, claiming priority based on Japanese Patent Application No. 2019-105889 filed Jun. 6, 2019, the entire contents of each of which being herein incorporate by reference in their entireties.

TECHNICAL FIELD

The present disclosure relates to an electronic device and particularly to an electronic device in which a pair of wiring substrates disposed to face each other is accommodated in a housing.

BACKGROUND ART

For example, Japanese Patent Laying-Open No. 2014-160378 (PTL 1) is one of literatures disclosing an electronic device in which a pair of wiring substrates disposed to face each other is accommodated in a housing. The literature discloses a programmable logic controller (PLC) that is a building block-type electronic device system constituted of component units including a power supply unit, a CPU unit, and I/O units. In each of these units (and only some of the I/O units), a pair of wiring substrates disposed to face each other is accommodated in a housing.

In the electronic device disclosed in the above-mentioned literature, a female connector is provided on a main surface of one of the paired wiring substrates and a male connector is provided on a main surface of the other of the paired wiring substrates. The paired wiring substrates are accommodated in the housing in the state where the paired wiring substrates are disposed to face each other such that the male connector is fitted to the female connector.

Further, the electronic device disclosed in the above-mentioned literature is configured as follows. Specifically, an external connection terminal enabling transmission of a reference potential is provided on a rear wall of the housing and a connection fitting pressed into contact with the external connection terminal is provided on a portion in a main surface that is close to a rear end of one of the paired wiring substrates. This allows transmission of a reference potential from outside to one of the paired wiring substrates.

On the other hand, the other of the paired wiring substrates is not directly connected to the external connection terminal. Although not clearly described, it is conceivable that a reference potential can be transmitted through the above-mentioned male connector and female connector from one to the other of the paired wiring substrates.

CITATION LIST Patent Literature

PTL 1: Japanese Patent Laying-Open No. 2014-160378

SUMMARY OF INVENTION

Technical Problem

In an electronic device in which a pair of wiring substrates is accommodated in a housing, this electronic device adopts one of the two following configurations including: a configuration in which the paired wiring substrates are separately fixed to the housing; and a configuration in which one of the paired wiring substrates is fixed to the other of the paired wiring substrates that is then fixed to the housing.

In particular, when a configuration in which a connector provided on one wiring substrate is fitted to a connector provided on the other wiring substrate is adopted in order to electrically connect a pair of these wiring substrates to each other as in the electronic device disclosed in the above-mentioned literature, the latter configuration of the above-described two configurations is often adopted from the viewpoint of allowing easy assembly operation. As a method of fixing the pair of wiring substrates to each other in this case, a stud (a pillar-shaped or cylindrical metal fitting having screw holes at both ends) is generally interposed between the paired wiring substrates and fixed with screws to each of the paired wiring substrates.

Thus, when the fixing method using the stud and the screws is adopted as a method of fixing the pair of wiring substrates in the electronic device disclosed in the above-mentioned literature, a space for installing the stud and the screws is further required in addition to the space for providing the above-mentioned connection fitting through which the reference potential is transmitted. This causes a problem that the mounting area of electronic components on each wiring substrate is reduced. This naturally requires upsizing of the electronic device in order to ensure a sufficient mounting area for electronic components.

On the other hand, when a configuration in which the paired wiring substrates are separately fixed to the housing (that is, the former configuration of the above-described two configurations) is adopted in the electronic device disclosed in the above-mentioned literature, the paired wiring substrates need to be separately fixed to the housing while the connector provided in one wiring substrate is fitted to the connector provided in the other wiring substrate. This also causes a problem that the assembly operation becomes significantly complicated.

Therefore, the present disclosure has been made in view of the above-described problems, and an object of the present disclosure is to allow both size reduction of and easy assembly operation for an electronic device in which a pair of wiring substrates disposed to face each other is accommodated in a housing.

Solution to Problem

An electronic device according to an aspect of the present disclosure includes a first wiring substrate, a second wiring substrate, a housing, a fixing member, and an external connection terminal. The first wiring substrate and the second wiring substrate each have a first main surface and a second main surface that are located on a front side and a rear side, respectively, as a pair of main surfaces. The first wiring substrate and the second wiring substrate are spaced apart from each other in a facing direction in which the first main surface of the first wiring substrate faces the first main surface of the second wiring substrate. The housing accommodates the first wiring substrate and the second wiring substrate. The fixing member includes a first fixing portion fixed to the first wiring substrate and a second fixing portion fixed to the second wiring substrate. The fixing member is interposed between the first wiring substrate and the second wiring substrate to fix the first wiring substrate and the second wiring substrate to each other. The external connection terminal is provided in the housing. The fixing member is formed of an electrically conductive member. The first wiring substrate is provided with a first electrically conductive portion. The second wiring substrate is provided with a second electrically conductive portion. The fixing member is electrically conductive to the first electrically conductive portion by fixing the first fixing portion to the first wiring substrate. The fixing member is electrically conductive to the second electrically conductive portion by fixing the second fixing portion to the second wiring substrate. The external connection terminal is electrically conductive to the fixing member by electrically connecting the fixing member to the external connection terminal.

By the configuration as described above, the first wiring substrate and the second wiring substrate can be firmly fixed with the fixing member while the external connection terminals can be electrically connected to the first wiring substrate and the second wiring substrate with the fixing member interposed therebetween. In other words, the fixing member can allow both: the physical fixation between the first wiring substrate and the second wiring substrate; and the electrical connection between the external connection terminal and each of the first wiring substrate and the second wiring substrate. This eliminates the need to fix one of the first wiring substrate and the second wiring substrate to the housing, and also eliminates the need to separately provide a space for the physical fixation and a space for the electrical connection as mentioned above. Therefore, adopting the above-described configuration can achieve both size reduction of and easy assembly operation for the electronic device.

In the electronic device according to the above-described one aspect of the present disclosure, it is preferable that the fixing member is formed of a metal plate-shaped member having a bent shape and including at least a plate-shaped base portion extending in the facing direction.

By the configuration as described above, the fixing member can be formed of, what is called, a press-molded product, so that the cost for components can be significantly reduced. In this case, since the fixing member has a plate-shaped base portion extending in the above-mentioned facing direction, the mechanical strength of the fixing member can be increased while reducing the material cost.

In the electronic device according to the above-described one aspect of the present disclosure, it is preferable that the first fixing portion is formed of a tongue-shaped portion standing upright from one end portion of the plate-shaped base portion to extend along the first main surface of the first wiring substrate, the one end portion of the plate-shaped base portion being located close to the first wiring substrate, and the second fixing portion is formed of a tongue-shaped portion standing upright from the other end portion of the plate-shaped base portion to extend along the first main surface of the second wiring substrate, the other end portion of the plate-shaped base portion being located close to the second wiring substrate.

By the configuration as described above, the tongue-shaped first fixing portion can be disposed to face the first main surface of the first wiring substrate, and the tongue-shaped second fixing portion can be disposed to face the first main surface of the second wiring substrate. Thus, the first fixing portion and the first wiring substrate can be fixed in a wide area in the in-plane direction of the first main surface of the first wiring substrate, and also, the second fixing portion and the second wiring substrate can be fixed in a wide area in the in-plane direction of the first main surface of the second wiring substrate. Therefore, the strength of attachment of the fixing member to the first wiring substrate and the second wiring substrate can be increased, and thus, the strength of fixation of the first wiring substrate and the second wiring substrate can be increased.

In the electronic device according to the above-described one aspect of the present disclosure, the fixing member may have a reinforcement portion having a tongue shape standing upright from an end portion of the plate-shaped base portion in a direction orthogonal to the facing direction and extending in the facing direction.

By the configuration as described above, the mechanical strength of the fixing member can be further increased in a simple configuration.

In the electronic device according to the above-described one aspect of the present disclosure, the fixing member may include a first positioning protrusion protruding in the facing direction with respect to the first fixing portion toward the first wiring substrate, and a second positioning protrusion protruding in the facing direction with respect to the second fixing portion toward the second wiring substrate. In this case, it is preferable that the first positioning protrusion is inserted into a cut-out portion or a recessed portion provided in the first wiring substrate to position the fixing member with respect to the first wiring substrate, and the second positioning protrusion is inserted into a cut-out portion or a recessed portion provided in the second wiring substrate to position the fixing member with respect to the second wiring substrate.

By the configuration as described above, the fixing member can be readily positioned with respect to the first wiring substrate and the second wiring substrate during assembly, thereby allowing further easy assembly operation.

In the electronic device according to the above-described one aspect of the present disclosure, the plate-shaped base portion may be provided with a bent portion such that the plate-shaped base portion has a stepped surface extending in a direction intersecting with the facing direction.

By the configuration as described above, the position at which the fixing member is fixed to the first wiring substrate and the position at which the fixing member is fixed to the second wiring substrate can be displaced from each other in the direction orthogonal to the facing direction in a simple configuration. Thus, these fixing positions are not necessarily located to face each other, so that the degree of freedom in designing the first wiring substrate and the second wiring substrate can be significantly increased.

In the electronic device according to the above-described one aspect of the present disclosure, the first fixing portion and the first wiring substrate may be fastened with a first fastening member to fix the first fixing portion to the first wiring substrate, and the second fixing portion and the second wiring substrate may be fastened with a second fastening member to fix the second fixing portion to the second wiring substrate.

By the configuration as described above, the fixing member can be readily attached to the first wiring substrate and the second wiring substrate with a fastening member such as a screw or a rivet, to thereby allow further easy assembly operation.

In the electronic device according to the above-described one aspect of the present disclosure, the housing may be provided with a guide groove that receives the first wiring substrate to be inserted into the housing in a direction orthogonal to the facing direction. In this case, the external connection terminal may be provided at a position on a deepest side in an insertion direction in which the first wiring substrate is inserted into the housing. In this case, it is preferable that the first wiring substrate is inserted into the housing in the insertion direction to press the fixing member into contact with the external connection terminal.

By the configuration as described above, in a simple operation of introducing the first wiring substrate into the guide groove provided in the housing and inserting the first wiring substrate into the housing, the assembly formed of the first wiring substrate, the second wiring substrate, and the fixing member can be fixed to the housing. Further, the fixing member is pressed into contact with the external connection terminal during the insertion, to thereby establish the electrical connection between the external connection terminal and each of the first wiring substrate and the second wiring substrate, so that the assembly operation can be dramatically improved.

In the electronic device according to the above-described one aspect of the present disclosure, it is preferable that a portion of the external connection terminal that is pressed into contact with the fixing member has a plate spring shape.

By the configuration as described above, the external connection terminal can be reliably pressed into contact with the fixing member during the above-mentioned insertion of the assembly into the housing. Thus, unintended contact failure can be prevented from occurring in these portions of connection.

Advantageous Effects of Invention

The present disclosure can achieve both size reduction of and easy assembly operation for an electronic device in which a pair of wiring substrates disposed to face each other is accommodated in a housing.

DESCRIPTION OF EMBODIMENTS

Figure 1:
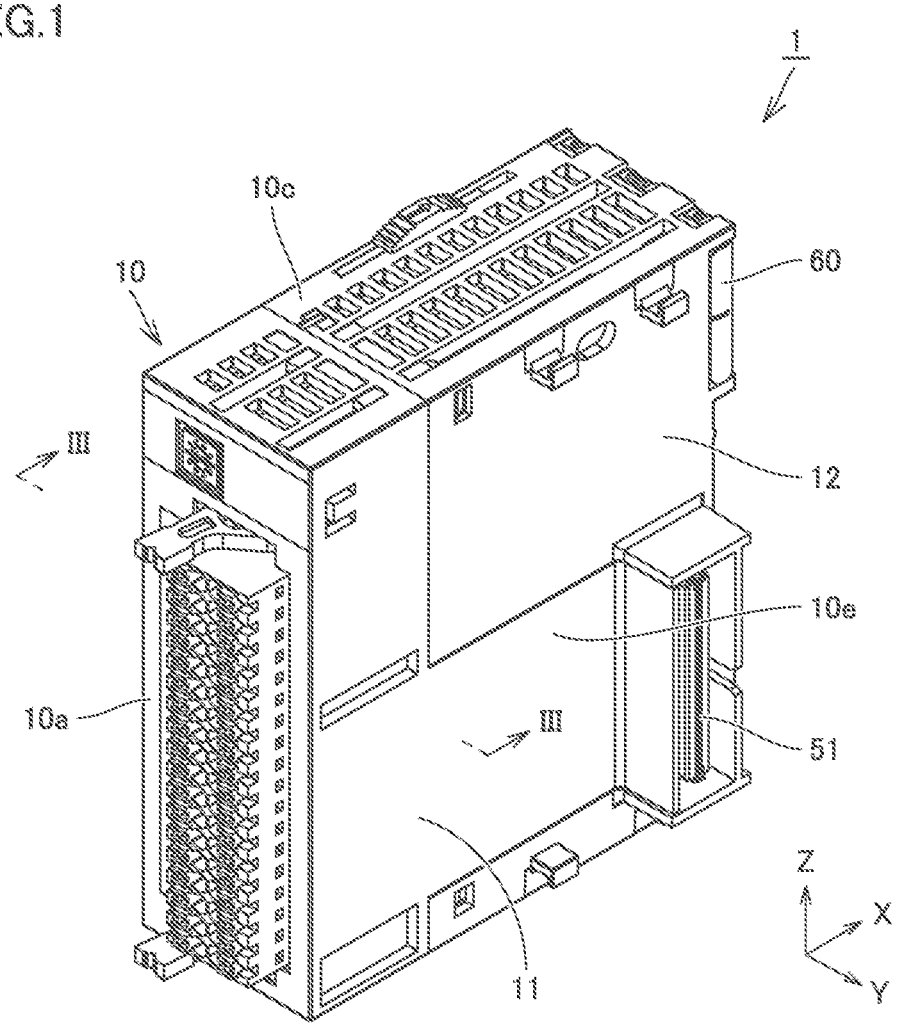
FIG. 1 is a schematic perspective view of an electronic device according to an embodiment.

In the following, embodiment will be described in detail with reference to the accompanying drawings. In the embodiments described below, the same or common portions are denoted by the same reference characters, and the description thereof will not be repeated.

<A. Schematic Configuration of Electronic Device>

Figure 2:
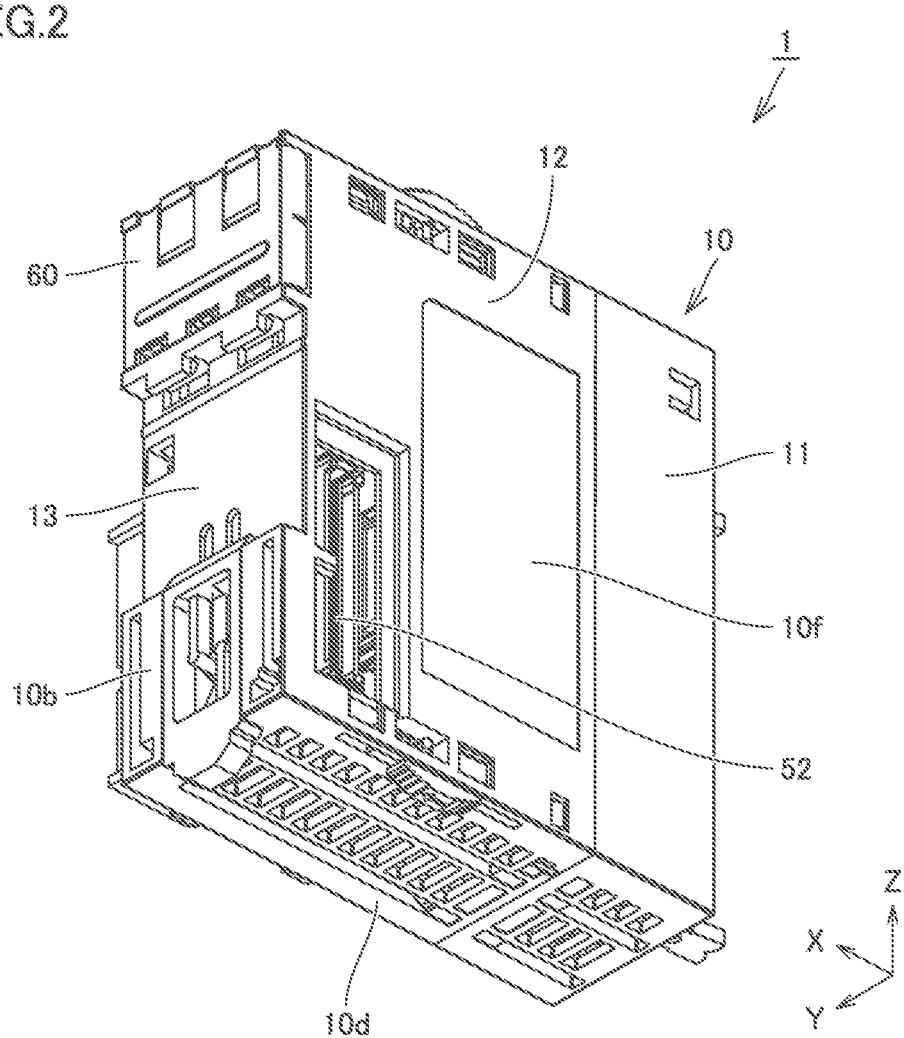
FIG. 2 is a schematic perspective view of the electronic device shown in FIG. 1 as viewed in a different direction.
Figure 3:
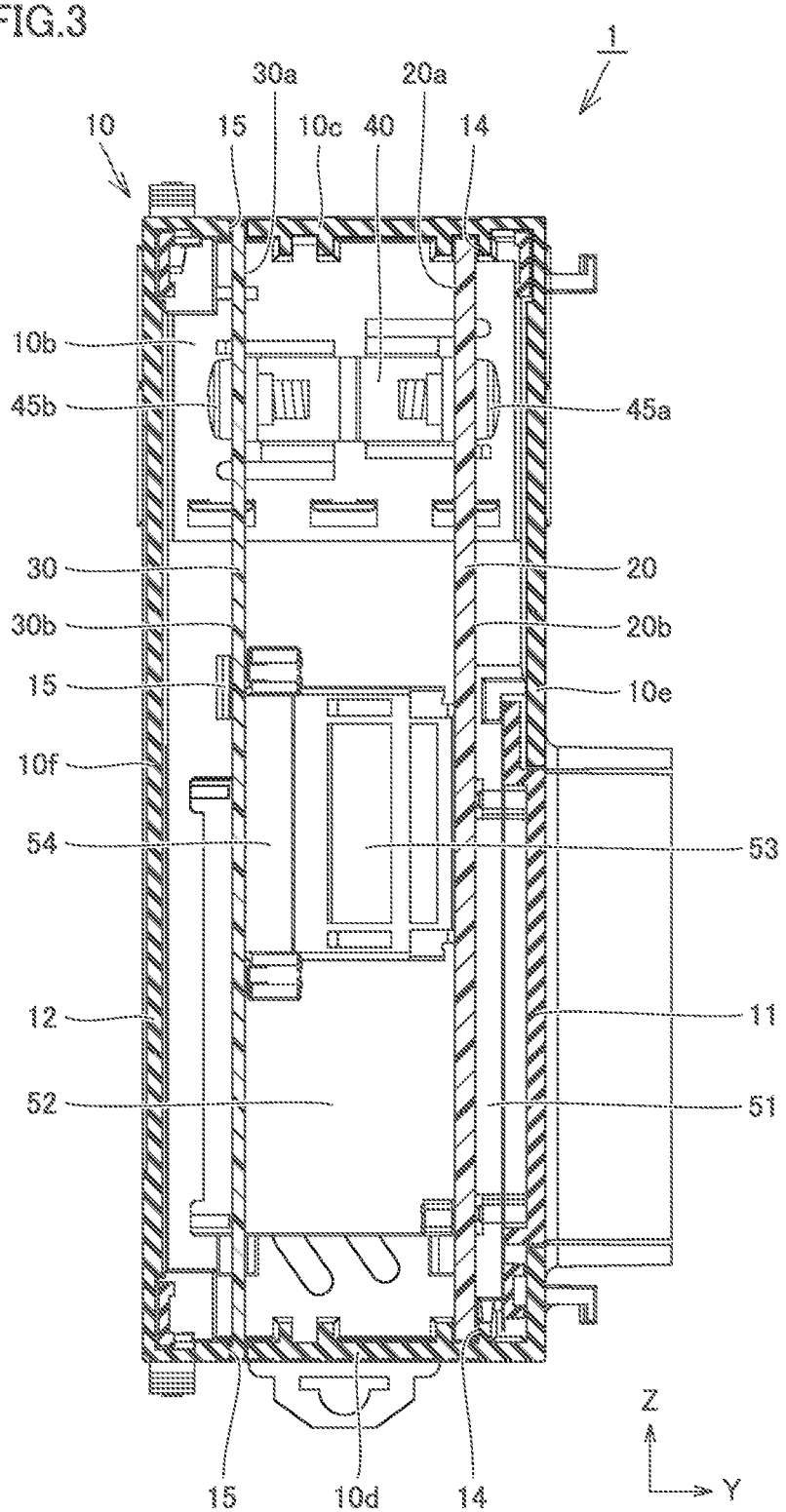
FIG. 3 is a schematic cross-sectional view of the electronic device shown in FIG. 1.
Figure 4:
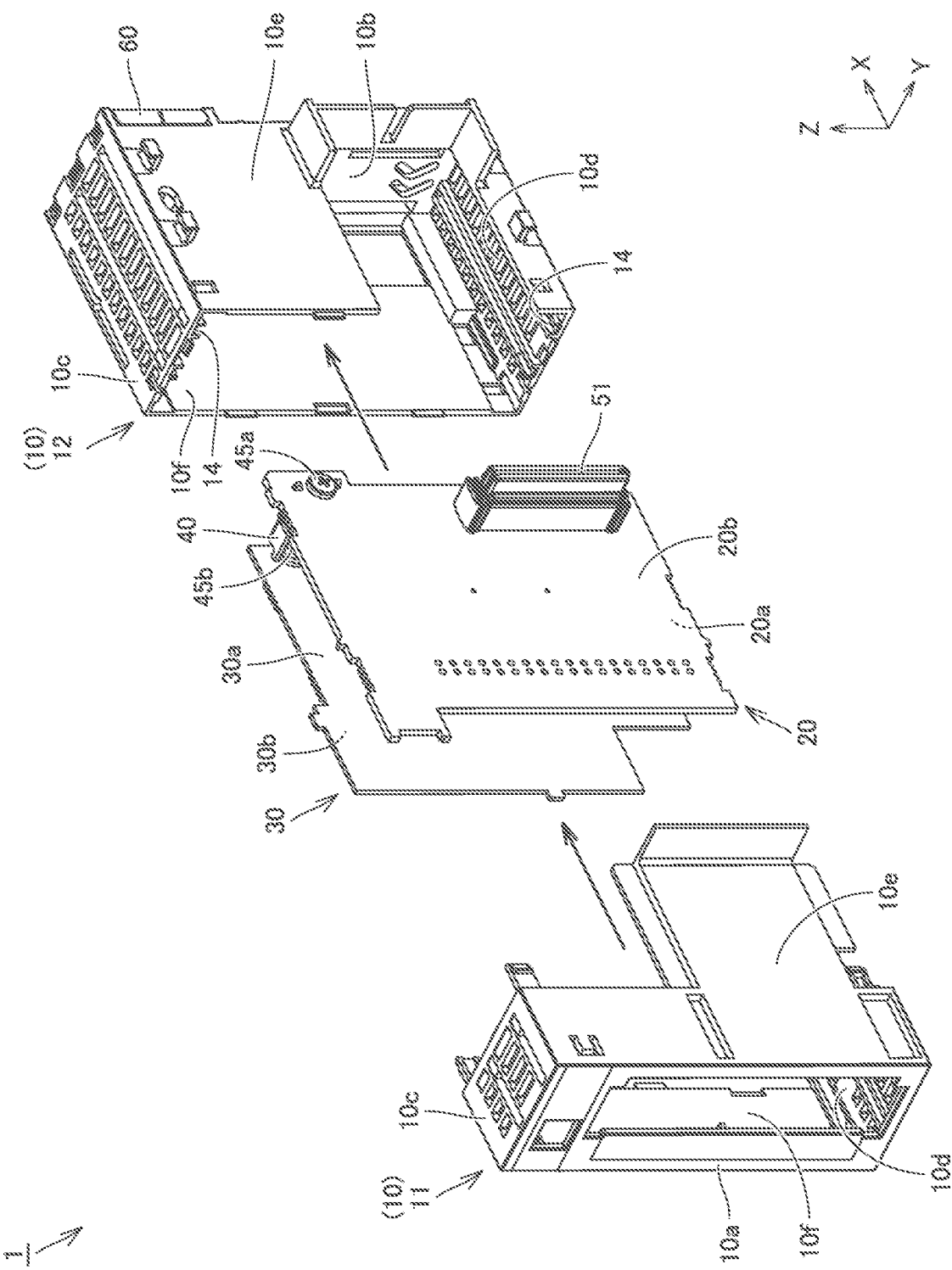
FIG. 4 is a partially exploded perspective view showing an assembly structure of the electronic device shown in FIG. 1.

FIG. 1 is a schematic perspective view of an electronic device according to an embodiment viewed from diagonally upper right on the front side. FIG. 2 is a schematic perspective view of the electronic device as viewed from diagonally lower left on the rear side. FIG. 3 is a schematic cross-sectional view of the electronic device taken along a line III-III shown in FIG. 1. FIG. 4 is a partially exploded perspective view showing an assembly structure of the electronic device. First, a schematic configuration of an electronic device 1 according to the present embodiment will be described with reference to FIGS. 1 to 4. Note that FIGS. 3 and 4 fail to show some components (mainly electronic components and the like) for the sake of easy understanding.

Electronic device 1 shown in FIGS. 1 to 4 forms a component unit of a programmable multi-axis motion controller as a building block-type electronic device system. The programmable multi-axis motion controller is a control device for performing multi-axis synchronous control at high speed and with high accuracy in the industrial field and suitably utilized, for example, in precision linear motor drive control requiring ultra-high speed response performance, nano-order positioning control, and the like.

In this case, the building block-type electronic device system is an electronic device system constituted of a plurality of electronic devices (each corresponding to the above-mentioned component unit) electrically connected to each other in the state where these electronic devices are assembled to be positioned side by side in a prescribed direction (in a Y-axis direction shown in the figure in electronic device 1 according to the present embodiment). This configuration is adopted in the above-mentioned PLC and the like in addition to the programmable multi-axis motion controller.

As shown in FIGS. 1 to 4, electronic device 1 has a substantially rectangular parallelepiped shape in which the length in the width direction (in the Y-axis direction shown in the figure) is shorter than the length in the height direction (in a Z-axis direction shown in the figure) and shorter than the length in the depth direction (in an X-axis direction shown in the figure), and mainly includes a housing 10, a first wiring substrate 20 and a second wiring substrate 30 that are accommodated in housing 10.

Housing 10 includes a front-side housing 11 and a rear-side housing 12, and has a box shape as a result of combination of front-side housing 11 and rear-side housing 12. Front-side housing 11 mainly constitutes parts of housing 10 that include a front wall 10*a*, a part of an upper wall 10*c*, a part of a lower wall 10*d*, a part of a right-side wall 10*e*, and a part of a left-side wall 10*f*. Rear-side housing 12 mainly constitutes parts of housing 10 that include a rear wall 10*b*, a part of upper wall 10*c*, a part of lower wall 10*d*, a part of right-side wall 10*e*, and a part of left-side wall 10*f*.

Front wall 10*a* of housing 10 is provided with a connection portion through which electronic device 1 is electrically connected to an external device (for example, a linear motor and the like). Rear wall 10*b* of housing 10 is provided with a rail attachment groove portion 13 along which rear wall 10*b* is detachably fixed to a DIN (German Industry Standard) rail, for example. Further, right-side wall 10*e* and left-side wall 10*f* of housing 10 are provided with connectors 51 and 52, respectively, for electrical connection to their respective adjacently installed component units.

Further, rear wall 10*b* of housing 10 is provided with an external connection terminal 60. External connection terminal 60 has a substantially C shape so as to cover a portion near the upper end of rear wall 10*b* of housing 10 and a portion near the upper end of each of right-side wall 10*e* and left-side wall 10*f* of housing 10. External connection terminal 60 allows transmission of a reference potential and is electrically connected to first wiring substrate 20 and second wiring substrate 30, as will be described later.

The portions of external connection terminal 60 that cover the above-mentioned respective portions near the upper ends of right-side wall 10e and left-side wall 10f serve to electrically connect external connection terminal 60 to the adjacently installed component units. Further, a portion of rear wall 10b of housing 10 that is covered by external connection terminal 60 is provided with an opening not shown in the figure. A prescribed portion of external connection terminal 60 faces the space inside housing 10 through the opening.

As shown in FIGS. 3 and 4, first wiring substrate 20 and second wiring substrate 30 each have a flat plate shape. First wiring substrate 20 has a first main surface 20a and a second main surface 20b as a pair of main surfaces located on the front side and the rear side of first wiring substrate 20. Second wiring substrate 30 has a first main surface 30a and a second main surface 30b as a pair of main surfaces located on the front side and the rear side of second wiring substrate 30.

First wiring substrate 20 and second wiring substrate 30 are accommodated in housing 10 as described above. First wiring substrate 20 and second wiring substrate 30 are spaced apart from each other such that first main surfaces 20a and 30a face each other, and thus, first wiring substrate 20 and second wiring substrate 30 are positioned to face each other inside housing 10. In this case, the facing direction in which first wiring substrate 20 and second wiring substrate 30 are disposed to face each other corresponds to the width direction of electronic device 1 (the Y-axis direction shown in the figure).

Various electronic components (not shown) are mounted on each of first main surface 20a and second main surface 20b of first wiring substrate 20. These electronic components are connected to electrically conductive patterns (not shown) provided on first wiring substrate 20, and are electrically connected to each other via the electrically conductive patterns. In this case, the above-mentioned connector 52 is provided on first main surface 20a of first wiring substrate 20 while the above-mentioned connector 51 is provided on second main surface 20b of first wiring substrate 20.

Various electronic components (not shown) are mounted on each of first main surface 30a and second main surface 30b of second wiring substrate 30. The electronic components are connected to electrically conductive patterns (not shown) provided on second wiring substrate 30 and are electrically connected to each other via the electrically conductive patterns. A portion of second wiring substrate 30 that faces connector 52 provided on first main surface 20a of first wiring substrate 20 is provided with a cut-out portion (not shown in the figure), and thereby, connector 52 is to be provided on left-side wall 10f of housing 10.

In this case, a connector 53 formed as a male connector is provided on first main surface 20a of first wiring substrate 20, and a connector 54 formed as a female connector is provided on first main surface 30a of second wiring substrate 30 (see FIG. 3). Connectors 53 and 54 are positioned so as to face each other, and are fitted to each other to thereby implement electrical connection between first wiring substrate 20 and second wiring substrate 30.

Thus, first wiring substrate 20, second wiring substrate 30, and various electronic components mounted thereon form a prescribed circuit to thereby achieve the electrical function as electronic device 1.

In electronic device 1 according to the present embodiment, second wiring substrate 30 is fixed to first wiring substrate 20 by using fixing member 40 while first wiring substrate 20 to which second wiring substrate 30 is fixed is fixed to housing 10. In other words, second wiring substrate 30 is firmly fixed to first wiring substrate 20 and lightly held by housing 10 in order to prevent its positional deviation with respect to housing 10 but is not firmly fixed to housing 10.

More specifically, as shown in FIGS. 3 and 4, guide grooves 14 provided as one pair extending in the depth direction (in the X-axis direction shown in the figure) of electronic device 1 are provided on the respective inner surfaces of upper wall 10c and lower wall 10d of housing 10. The upper and lower peripheral edges of first wiring substrate 20 are introduced into the paired guide grooves 14 and first wiring substrate 20 is held by holding portions formed of protruding portions (not shown in the figure) provided on rear wall 10b of housing 10, so that first wiring substrate 20 is firmly fixed to housing 10.

On the other hand, second wiring substrate 30 is lightly held by a locking portion 15 formed as a protruding portion or a recessed portion locally provided on each of rear wall 10b, upper wall 10c, lower wall 10d, and the like of housing 10 so as to prevent positional deviation of second wiring substrate 30. However, second wiring substrate 30 is not firmly fixed to housing 10 while it is firmly fixed to first wiring substrate 20 with fixing member 40 as described above.

Thereby, as shown in FIG. 4, first wiring substrate 20 and second wiring substrate 30 are fixed to each other by using fixing member 40 in advance and thereby formed as an assembly. Then, the assembly formed of first wiring substrate 20, second wiring substrate 30, fixing member 40, and the like is accommodated in rear-side housing 12 to which front-side housing 11 is subsequently attached to thereby form an assembly of electronic device 1. In such a very simple operation, electronic device 1 can be manufactured.

<B. Structure for Fixing First Wiring Substrate and Second Wiring Substrate>

Figure 5:
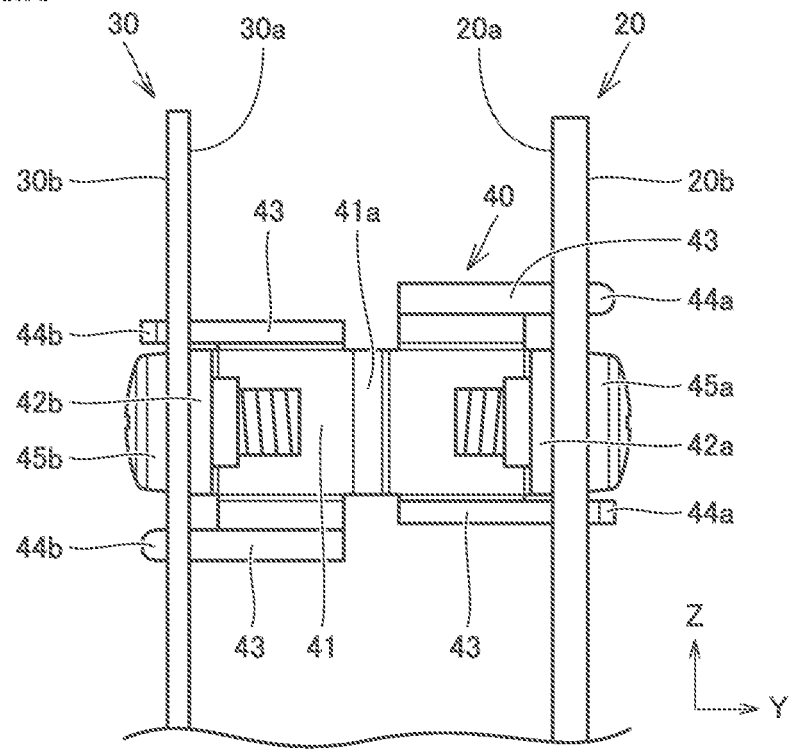
FIG. 5 is a front view showing a structure for fixing a first wiring substrate and a second wiring substrate in the electronic device shown in FIG. 1.
Figure 6:
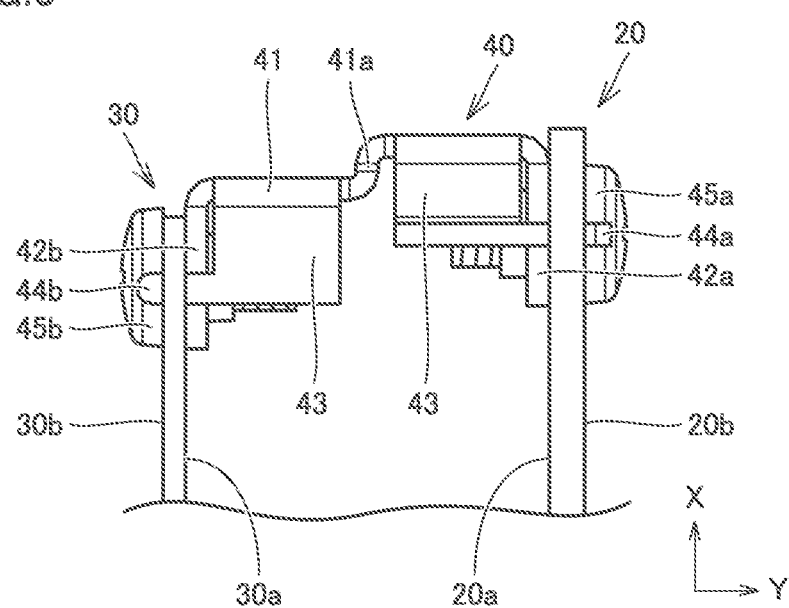
FIG. 6 is a plan view showing the structure for fixing the first wiring substrate and the second wiring substrate in the electronic device shown in FIG. 1.
Figure 7:
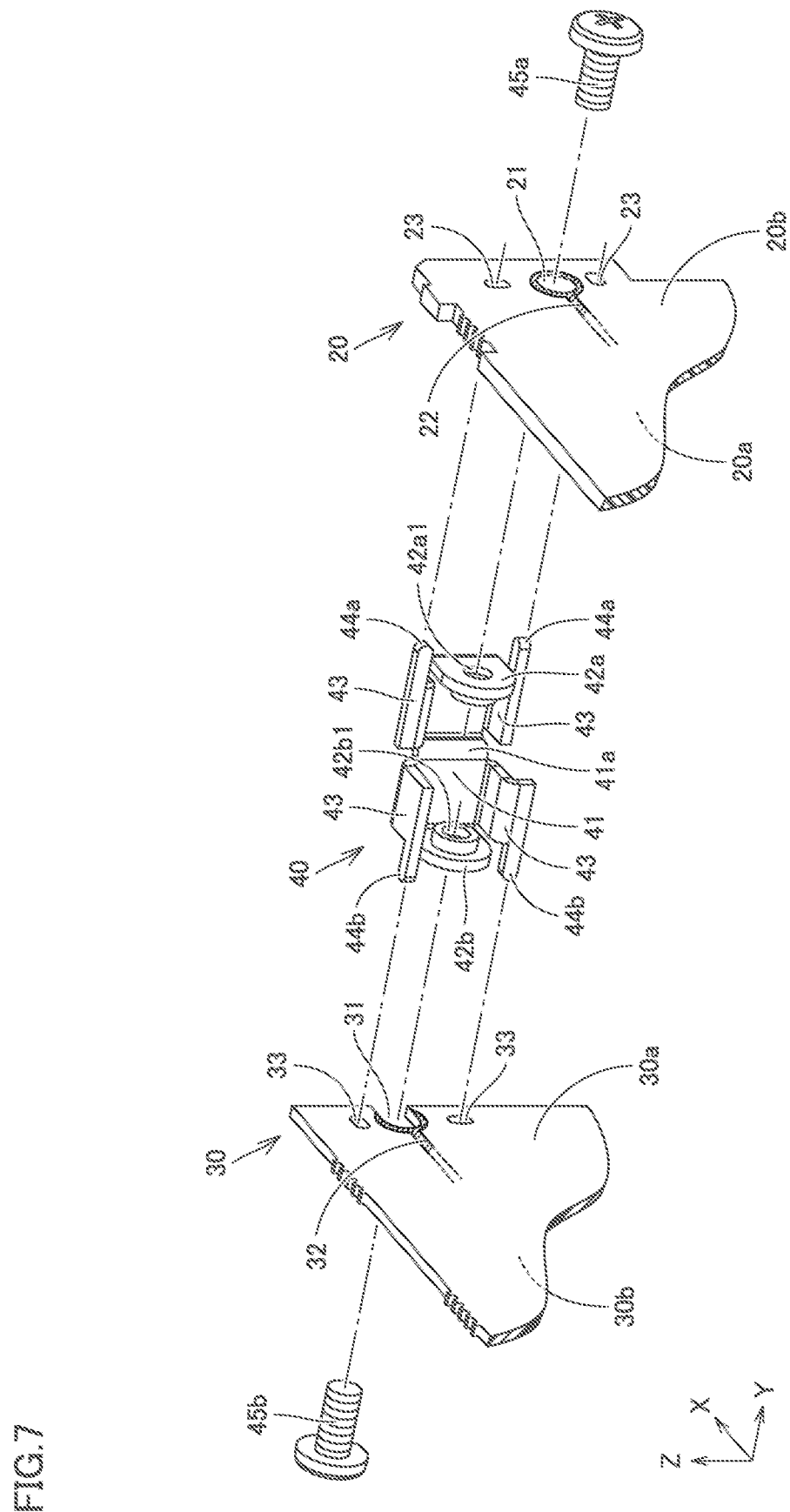
FIG. 7 is an exploded perspective view showing the structure for fixing the first wiring substrate and the second wiring substrate in the electronic device shown in FIG. 1.

FIG. 5 is a front view showing a structure for fixing the first wiring substrate and the second wiring substrate in the electronic device according to the present embodiment and FIG. 6 is a plan view thereof. FIG. 7 is an exploded perspective view showing the structure for fixing. The following specifically describes the structure for fixing first wiring substrate 20 and second wiring substrate 30 in electronic device 1 according to the present embodiment with reference to FIGS. 5 to 7 and the above-mentioned FIGS. 3 and 4. Note that FIGS. 5 to 7 each fail to show some components (mainly electronic components and the like) for the sake of easy understanding.

As shown in FIGS. 3 to 7, in electronic device 1, first wiring substrate 20 and second wiring substrate 30 are fixed to each other with fixing member 40 at a portion closer to the upper end and the rear end of each of first wiring substrate 20 and second wiring substrate 30. In this case, fixing member 40 is positioned to face external connection terminal 60 provided on rear wall 10b of housing 10.

Fixing member 40 is made of an electrically conductive member. In the present embodiment, fixing member 40 is formed of a press-molded product formed by pressing a metal plate member so as to have a bent shape. More specifically, in the present embodiment, fixing member 40 is formed of a cold-rolled steel sheet (SPCC) plated with nickel. Fixing member 40 is interposed between first wiring substrate 20 and second wiring substrate 30 to thereby fix first wiring substrate 20 and second wiring substrate 30 to each other.

As shown in FIGS. 5 to 7, fixing member 40 mainly includes: a plate-shaped base portion 41 extending in the facing direction in which first wiring substrate 20 and second wiring substrate 30 face each other (in the Y-axis direction shown in FIG. 7); a first fixing portion 42a formed of a tongue-shaped portion standing upright from one end portion of plate-shaped base portion 41 that is located close to first wiring substrate 20; and a second fixing portion 42b formed of a tongue-shaped portion standing upright from the other end portion of plate-shaped base portion 41 that is located close to second wiring substrate 30.

Plate-shaped base portion 41 has a bent portion 41a at its intermediate position so as to have a stepped surface extending in a direction intersecting with the above-mentioned facing direction. Bent portion 41a is provided for causing displacement between the position of first fixing portion 42a and the position of second fixing portion 42b from each other in the direction orthogonal to the facing direction.

First fixing portion 42a formed of a tongue-shaped portion is positioned to face first main surface 20a of first wiring substrate 20 and provided with a first screw hole 42a1 (see FIG. 7) at its prescribed position. First screw hole 42a1 has an inner circumferential surface provided with a female thread portion.

Second fixing portion 42b formed of a tongue-shaped portion is positioned to face first main surface 30a of second wiring substrate 30 and provided with a second screw hole 42b1 (see FIG. 7) at its prescribed position. Second screw hole 42b1 has an inner circumferential surface provided with a female thread portion.

Further, fixing member 40 is provided with a plurality of reinforcement portions 43 so as to stand upright from both end portions of plate-shaped base portion 41 in the direction orthogonal to the facing direction. The plurality of reinforcement portions 43 each are formed in a tongue shape so as to extend in the above-mentioned facing direction, to thereby reinforce plate-shaped base portion 41. By bending a part of fixing member 40 so as to provide reinforcement portion 43 in this way, the mechanical strength of fixing member 40 can be enhanced in a simple configuration.

Further, fixing member 40 has a pair of first positioning protrusions 44a protruding with respect to first fixing portion 42a toward first wiring substrate 20 in the facing direction, and a pair of second positioning protrusions 44b protruding with respect to second fixing portion 42b toward second wiring substrate 30 in the facing direction. The pair of first positioning protrusions 44a and the pair of second positioning protrusions 44b are provided so as to extend from the above-mentioned respective reinforcement portions 43.

The pair of first positioning protrusions 44a is used for positioning fixing member 40 with respect to first wiring substrate 20 and the pair of second positioning protrusions 44b is used for positioning fixing member 40 with respect to second wiring substrate 30. The details thereof will be described later.

As shown in FIG. 7, a first through portion 21 formed in a hole shape is provided at a prescribed position of first wiring substrate 20 so as to reach first main surface 20a and second main surface 20b. First through portion 21 is provided at a position corresponding to the above-mentioned first screw hole 42a1 provided in first fixing portion 42a of fixing member 40.

In this case, a first electrically conductive portion 22 is provided on a portion around first through portion 21 in each of first main surface 20a and second main surface 20b. First electrically conductive portion 22 is formed, for example, of an electrically conductive pattern and serves to transmit a reference potential. Note that first electrically conductive portion 22 is not necessarily provided on both first main surface 20a and second main surface 20b but may be provided on only one of first main surface 20a and second main surface 20b.

Further, a pair of first positioning hole portions 23 each having a cut-out shape (a hole shape in this case) is provided at prescribed positions of first wiring substrate 20 so as to reach first main surface 20a and second main surface 20b. Such paired first positioning hole portions 23 are provided at respective positions corresponding to the above-mentioned paired first positioning protrusions 44a provided in fixing member 40.

On the other hand, a second through portion 31 having a cut-out shape is provided at a prescribed position of second wiring substrate 30 so as to reach first main surface 30a and second main surface 30b. Second through portion 31 is provided at a position corresponding to the above-mentioned second screw hole 42b1 provided in second fixing portion 42b of fixing member 40.

In this case, a second electrically conductive portion 32 is provided on a portion around second through portion 31 in each of first main surface 30a and second main surface 30b. Second electrically conductive portion 32 is formed, for example, of an electrically conductive pattern and serves to transmit a reference potential. Note that second electrically conductive portion 32 is not necessarily provided on both first main surface 30a and second main surface 30b but may be provided on only one of first main surface 30a and second main surface 30b.

Further, a pair of second positioning hole portions 33 each having a cut-out shape (a hole shape in this case) is provided at prescribed positions of second wiring substrate 30 so as to reach first main surface 30a and second main surface 30b. Such paired second positioning hole portions 33 are provided at respective positions corresponding to the above-mentioned paired second positioning protrusions 44b provided in fixing member 40.

In this case, as shown in FIGS. 3 to 7, fixing member 40 is fixed to first wiring substrate 20 by fastening first fixing portion 42a to first wiring substrate 20 with a first screw 45a as the first fastening member. More specifically, fixing member 40 is positioned with respect to first wiring substrate 20 such that first screw hole 42a1 provided in first fixing portion 42a of fixing member 40 faces first through portion 21 of first wiring substrate 20. In this state, first screw 45a is screwed into first screw hole 42a1 from the second main surface 20b side of first wiring substrate 20, and thereby, fixing member 40 is fixed to first wiring substrate 20.

At this time, the paired first positioning protrusions 44a provided in advance in fixing member 40 are inserted into the paired respective first positioning hole portions 23 provided in first wiring substrate 20, to thereby allow positioning between first screw hole 42a1 and first through portion 21. Thereby, fixing member 40 can be readily positioned with respect to first wiring substrate 20. Note that first positioning hole portion 23 may be formed to have a recessed portion in place of a cut-out shape.

Further, fixing member 40 is fixed to second wiring substrate 30 by fastening second fixing portion 42b to second wiring substrate 30 with a second screw 45b as the second fastening member. More specifically, fixing member 40 is positioned with respect to second wiring substrate 30 such that second screw hole 42b1 provided in second fixing portion 42b of fixing member 40 faces second through portion 31 of second wiring substrate 30. In this state, second screw 45b is screwed into second screw hole 42b1 from the second main surface 30b side of second wiring substrate 30, and thereby, fixing member 40 is fixed to second wiring substrate 30.

At this time, the paired second positioning protrusions 44b provided in advance in fixing member 40 are inserted into the paired respective second positioning hole portions 33 provided in second wiring substrate 30, to thereby allow positioning between second screw hole 42b1 and second through portion 31. Thereby, fixing member 40 can be readily positioned with respect to second wiring substrate 30. Note that second positioning hole portion 33 may be formed to have a recessed portion in place of a cut-out shape.

As described above, first wiring substrate 20 and second wiring substrate 30 are fixed to each other with fixing member 40, and thereby, first wiring substrate 20 and second wiring substrate 30 are physically fixed to each other.

<C. Structure of Connection between Fixing Member and External Connection Terminal>

Figure 8:
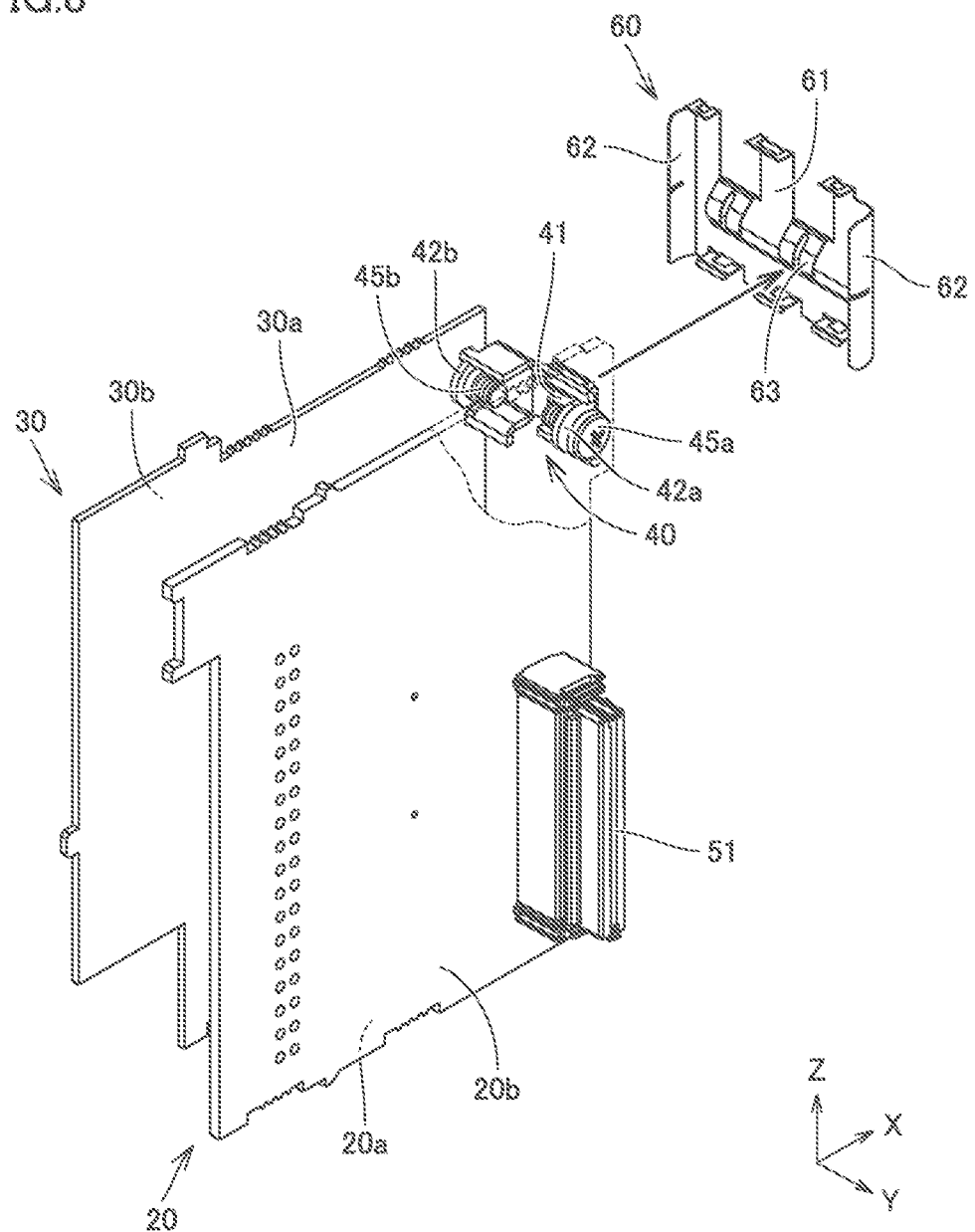
FIG. 8 is a schematic perspective view showing a structure of connection between a fixing member and an external connection terminal in the electronic device shown in FIG. 1.

FIG. 8 is a schematic perspective view showing a structure of connection between the fixing member and the external connection terminal in the electronic device according to the present embodiment. The following specifically describes a structure of connection between fixing member 40 and external connection terminal 60 in electronic device 1 according to the present embodiment with reference to FIG. 8. FIG. 8 fails to show some components (mainly electronic components and the like) for the sake of easy understanding but shows a part of first wiring substrate 20 in a cut away view.

As shown in FIG. 8, external connection terminal 60 has: a base portion 61 that covers rear wall 10b of housing 10; a pair of external connection portions 62 that cover right-side wall 10e and left-side wall 10f of housing 10; and a plate spring-shaped contact 63 that is disposed to face the above-mentioned opening provided in rear wall 10b of housing 10. Among these components, the pair of external connection portions 62 serves to electrically connect external connection terminal 60 to a component unit disposed adjacent to electronic device 1.

Plate spring-shaped contact 63 is inserted into the above-mentioned opening and thereby positioned to protrude into the space inside housing 10. Thereby, plate spring-shaped contact 63 is disposed at a position on the deepest side of housing 10 in the depth direction of electronic device 1 (in the X-axis direction shown in the figure).

In this case, when electronic device 1 is manufactured, the assembly formed of first wiring substrate 20, second wiring substrate 30, fixing member 40, and the like is inserted from the front side into rear-side housing 12 and thereby attached to rear-side housing 12, as described above. At this time, the pair of guide grooves 14 receives and guides first wiring substrate 20, and thereby, the above-mentioned assembly is guided in the depth direction of electronic device 1.

Thus, by inserting the above-mentioned assembly toward the deepest side of rear-side housing 12, a prescribed position of plate-shaped base portion 41 provided in fixing member 40 is pressed into contact with plate spring-shaped contact 63 of external connection terminal 60 disposed on the deepest side of housing 10. Thereby, fixing member 40 is electrically connected to external connection terminal 60, and thus, external connection terminal 60 is electrically conductive via fixing member 40 to both first electrically conductive portion 22 of first wiring substrate 20 and second electrically conductive portion 32 of second wiring substrate 30.

<D. Conclusion>

As in the above description, according to electronic device 1 in the present embodiment, first wiring substrate 20 and second wiring substrate 30 can be firmly fixed by using fixing member 40, and external connection terminal 60 for transmitting a reference potential can be electrically connected via fixing member 40 to first wiring substrate 20 and second wiring substrate 30, as described above. In other words, fixing member 40 allows both: the physical fixation between first wiring substrate 20 and second wiring substrate 30; and the electrical connection between external connection terminal 60 and each of first wiring substrate 20 and second wiring substrate 30.

Thus, adopting the above-described configuration eliminates the need to firmly fix second wiring substrate 30 to housing 10 and also eliminates the need to separately provide spaces for the above-mentioned physical fixation and electrical connection. Therefore, electronic device 1 that is reduced in size and fabricated in easy assembly operation can be implemented.

Further, according to electronic device 1 in the present embodiment described above, fixing member 40 can be formed of, what is called, a press-molded product, and therefore, the component cost can be significantly reduced. Further, since fixing member 40 has plate-shaped base portion 41 extending in the above-mentioned facing direction, the mechanical strength of fixing member 40 can also be increased while reducing the material cost.

Further, according to electronic device 1 in the present embodiment described above, tongue-shaped first fixing portion 42a and tongue-shaped second fixing portion 42b can be disposed to face first main surface 20a of first wiring substrate 20 and first main surface 30a of second wiring substrate 30, respectively. Thus, first fixing portion 42a and second fixing portion 42b can be fixed to first wiring substrate 20 and second wiring substrate 30, respectively, in a wide area in the in-plane direction of first wiring substrate 20 and second wiring substrate 30. Therefore, adopting the above-described configuration can increase the strength of attachment of fixing member 40 to first wiring substrate 20 and second wiring substrate 30, and also can increase the strength of fixation between first wiring substrate 20 and second wiring substrate 30.

Further, according to electronic device 1 in the present embodiment described above, the position at which fixing members 40 is fixed to first wiring substrate 20 and the position at which fixing members 40 is fixed to second wiring substrate 30 can be displaced from each other in the direction orthogonal to the above-mentioned facing direction in a simple configuration in which bent portion 41a is provided in plate-shaped base portion 41 of fixing member 40. Accordingly, these fixing positions are not necessarily located to face each other, so that the degree of freedom in designing first wiring substrate 20 and second wiring substrate 30 can be significantly increased.

Further, according to electronic device 1 in the present embodiment described above, fixing member 40 can be readily attached to first wiring substrate 20 and second wiring substrate 30 with first screw 45a and second screw 45b, respectively. Thus, adopting the above-described configuration allows further easy assembly operation. Note that first screw 45a and second screw 45b may be replaced with a rivet and the like.

Further, according to electronic device 1 in the present embodiment described above, in a simple operation of introducing first wiring substrate 20 into guide groove 14 provided in housing 10 and then inserting first wiring substrate 20 into housing 10, the assembly formed of first wiring substrate 20, second wiring substrate 30, fixing member 40, and the like can be fixed to housing 10. Further, fixing member 40 is pressed into contact with external connection terminal 60 during insertion, to thereby establish electrical connection between external connection terminal 60 and each of first wiring substrate 20 and second wiring substrate 30. Thus, adopting the above-described configuration can dramatically improve the assembly operation.

In addition, according to electronic device 1 in the present embodiment described above, contact 63 provided on external connection terminal 60 has a plate spring shape, so that pressure contact between external connection terminal 60 and fixing member 40 can be ensured during the above-mentioned insertion of the assembly into housing 10. Thus, adopting the above-described configuration can prevent occurrence of contact failure between external connection terminal 60 and fixing member 40.

<E. Additional Description>

The following summarizes the characteristic configuration of electronic device 1 according to the above-described present embodiment.

[Configuration 1]

An electronic device comprising:
a first wiring substrate (20) and a second wiring substrate (30) each having a first main surface (20a, 30a) and a second main surface (20b, 30b) that are located on a front surface and a rear surface, respectively, as a pair of main surfaces (20a, 30a), the first wiring substrate and the second wiring substrate being spaced apart from each other in a facing direction in which the first main surface of the first wiring substrate faces the first main surface of the second wiring substrate;
a housing (10) that accommodates the first wiring substrate and the second wiring substrate;
a fixing member (40) including a first fixing portion (42a) fixed to the first wiring substrate and a second fixing portion (42b) fixed to the second wiring substrate, the fixing member being interposed between the first wiring substrate and the second wiring substrate to fix the first wiring substrate and the second wiring substrate to each other; and
an external connection terminal (60) provided in the housing, wherein
the fixing member is formed of an electrically conductive member,
the first wiring substrate is provided with a first electrically conductive portion (22),
the second wiring substrate is provided with a second electrically conductive portion (32),
the fixing member is electrically conductive to the first electrically conductive portion by fixing the first fixing portion to the first wiring substrate,
the fixing member is electrically conductive to the second electrically conductive portion by fixing the second fixing portion to the second wiring substrate, and
the external connection terminal is electrically conductive to the fixing member by electrically connecting the fixing member to the external connection terminal.

[Configuration 2]

The electronic device according to Configuration 1, wherein the fixing member is formed of a metal plate-shaped member having a bent shape and including at least a plate-shaped base portion (41) extending in the facing direction.

[Configuration 3]

The electronic device according to Configuration 2, wherein
the first fixing portion is formed of a tongue-shaped portion standing upright from one end portion of the plate-shaped base portion to extend along the first main surface of the first wiring substrate, the one end portion of the plate-shaped base portion being located close to the first wiring substrate, and
the second fixing portion is formed of a tongue-shaped portion standing upright from the other end portion of the plate-shaped base portion to extend along the first main surface of the second wiring substrate, the other end portion of the plate-shaped base portion being located close to the second wiring substrate.

[Configuration 4]

The electronic device according to Configuration 2 or 3, wherein the fixing member has a reinforcement portion (43) having a tongue shape standing upright from an end portion of the plate-shaped base portion in a direction orthogonal to the facing direction and extending in the facing direction.

[Configuration 5]

The electronic device according to any one of Configurations 2 to 4, wherein
the fixing member includes
a first positioning protrusion (44a) protruding in the facing direction with respect to the first fixing portion toward the first wiring substrate, and
a second positioning protrusion (44b) protruding in the facing direction with respect to the second fixing portion toward the second wiring substrate,
the first positioning protrusion is inserted into a cut-out portion (23) or a recessed portion (23) provided in the first wiring substrate to position the fixing member with respect to the first wiring substrate, and
the second positioning protrusion is inserted into a cut-out portion (33) or a recessed portion (33) provided in the second wiring substrate to position the fixing member with respect to the second wiring substrate.

[Configuration 6]

The electronic device according to any one of Configurations 2 to 5, wherein the plate-shaped base portion is provided with a bent portion (41a) such that the plate-shaped base portion has a stepped surface extending in a direction intersecting with the facing direction.

[Configuration 7]

The electronic device according to any one of Configurations 2 to 6, wherein the first fixing portion and the first wiring substrate are fastened with a first fastening member (45a) to fix the first fixing portion to the first wiring substrate, and the second fixing portion and the second wiring substrate are fastened with a second fastening member (45b) to fix the second fixing portion to the second wiring substrate.

[Configuration 8]

The electronic device according to any one of Configurations 1 to 7, wherein the housing is provided with a guide groove (14) that receives the first wiring substrate to be inserted into the housing in a direction orthogonal to the facing direction,
the external connection terminal is provided at a position on a deepest side in an insertion direction in which the first wiring substrate is inserted into the housing, and the first wiring substrate is inserted into the housing in the insertion direction to press the fixing member into contact with the external connection terminal.

[Configuration 9]

The electronic device according to Configuration 8, wherein a portion (63) of the external connection terminal that is pressed into contact with the fixing member has a plate spring shape.

<F. Other Embodiments and the Like>

The above embodiment has been described with reference to an example of a configuration in which the fixing member is fixed with screws to both the paired wiring substrates, but may be fixed by other fixing methods to one or both of the wiring substrates. In addition to the above-mentioned riveting, examples of other fixing methods include bonding using a brazing material such as solder, bonding using an electrically conductive adhesive, fixing by means of welding, caulking, and the like.

Further, the above embodiment has been described with reference to an example of a case where a bent portion is provided in the plate-shaped base portion of the fixing member, but the bent portion is not necessarily provided. In addition, the above embodiment has been described with reference to an example of a case where a reinforcement portion and a positioning protrusion are provided in the fixing member, but these portions are not necessarily provided.

Further, the above embodiment has been described with reference to an example of a configuration in which the fixing member and the external connection terminal are pressed into contact with each other so as to be electrically connected to each other, but the method of connecting the fixing member and the external connection terminal is not limited thereto, and any other connection methods may be used.

Further, the above embodiment has been described with reference to an example of a configuration in which a reference potential is transmitted from the external connection terminal to the first wiring substrate and the second wiring substrate via the fixing member, but other electrical signals and the like may be transmitted from the external connection terminal to the first wiring substrate and the second wiring substrate via the fixing member, or other electrical signals and the like may be transmitted from the first wiring substrate and the second wiring substrate to the external connection terminal via the fixing member.

Further, the above embodiment has been described with reference to an example of a case where the present invention is applied to a component unit of a programmable multi-axis motion controller, but the present invention can also be naturally applicable to other electronic devices represented by a component unit of a PLC or the like. Further, the present invention can also be applicable to electronic devices having various configurations without being limited to a building block-type electronic device.

The above embodiments disclosed herein are illustrative in all respects and should not be construed as being restrictive. The technical scope of the present invention is defined by the terms of the claims, and is intended to include any modifications within the meaning and scope equivalent to the terms of the claims.

REFERENCE SIGNS LIST 1 electronic device, 10 housing, 10a front wall, 10b rear wall, 10c upper wall, 10d lower wall, 10e right-side wall, 10f left-side wall, 11 front-side housing, 12 rear-side housing, 13 rail attachment groove portion, 14 guide groove, 15 locking portion, 20 first wiring substrate, 20a first main surface, 20b second main surface, 21 first through portion, 22 first electrically conductive portion, 23 first positioning hole portion, 30 second wiring substrate, 30a first main surface, 30b second main surface, 31 second through portion, 32 second electrically conductive portion, 33 second positioning hole portion, 40 fixing member, 41 plate-shaped base portion, 41a bent portion, 42a first fixing portion, 42a1 first screw hole, 42b second fixing portion, 42b1 second screw hole, 43 reinforcement portion, 44a first positioning protrusion, 44b second positioning protrusion, 45a first screw, 45b second screw, 51 to 54 connector, 60 external connection terminal, 61 base portion, 62 external connection portion, 63 contact.

The invention claimed is:

1. An electronic device comprising:
a first wiring substrate and a second wiring substrate each having a first main surface and a second main surface that are located on a front side and a rear side, respectively, the first wiring substrate and the second wiring substrate being spaced apart from each other in a facing direction in which the first main surface of the first wiring substrate faces the first main surface of the second wiring substrate;
a housing that accommodates the first wiring substrate and the second wiring substrate;
a fixing member including a first fixing portion fixed to the first wiring substrate and a second fixing portion fixed to the second wiring substrate, the fixing member being interposed between the first wiring substrate and the second wiring substrate to fix the first wiring substrate and the second wiring substrate to each other; and
an external connection terminal provided in the housing, wherein
the fixing member is formed of an electrically conductive member,
the first wiring substrate is provided with a first electrically conductive portion,
the second wiring substrate is provided with a second electrically conductive portion,
the fixing member is electrically conductive to the first electrically conductive portion by fixing the first fixing portion to the first wiring substrate,
the fixing member is electrically conductive to the second electrically conductive portion by fixing the second fixing portion to the second wiring substrate, and
the external connection terminal is electrically conductive to the fixing member by electrically connecting the fixing member to the external connection terminal,
wherein:
the housing is provided with a guide groove that receives the first wiring substrate to be inserted into the housing in a direction orthogonal to the facing direction,
the external connection terminal is provided at a position on a deepest side in an insertion direction in which the first wiring substrate is inserted into the housing, and
the first wiring substrate is inserted into the housing in the insertion direction to press the fixing member into contact with the external connection terminal.

2. The electronic device according to claim 1, wherein the fixing member is formed of a metal plate-shaped member having a bent shape and including at least a plate-shaped base portion extending in the facing direction.

3. The electronic device according to claim 2, wherein
the first fixing portion is formed of a first tongue-shaped portion standing upright from one end portion of the plate-shaped base portion to extend along the first main surface of the first wiring substrate, the one end portion of the plate-shaped base portion being located close to the first wiring substrate, and
the second fixing portion is formed of a second tongue-shaped portion standing upright from an other end portion of the plate-shaped base portion to extend along the first main surface of the second wiring substrate, the other end portion of the plate-shaped base portion being located close to the second wiring substrate.

4. The electronic device according to claim 2, wherein the fixing member has a reinforcement portion having a tongue shape standing upright from an end portion of the plate-shaped base portion in a direction orthogonal to the facing direction and extending in the facing direction.

5. The electronic device according to claim 2, wherein the fixing member includes
a first positioning protrusion protruding in the facing direction with respect to the first fixing portion toward the first wiring substrate, and
a second positioning protrusion protruding in the facing direction with respect to the second fixing portion toward the second wiring substrate,
the first positioning protrusion is inserted into a first cut-out portion or a first recessed portion provided in the first wiring substrate to position the fixing member with respect to the first wiring substrate, and
the second positioning protrusion is inserted into a second cut-out portion or a second recessed portion provided in the second wiring substrate to position the fixing member with respect to the second wiring substrate.

6. The electronic device according to claim 2, wherein the plate-shaped base portion is provided with a bent portion such that the plate-shaped base portion has a stepped surface extending in a direction intersecting with the facing direction.

7. The electronic device according to claim 2, wherein
the first fixing portion and the first wiring substrate are fastened with a first fastening member to fix the first fixing portion to the first wiring substrate, and
the second fixing portion and the second wiring substrate are fastened with a second fastening member to fix the second fixing portion to the second wiring substrate.

8. The electronic device according to claim 1, wherein a portion of the external connection terminal that is pressed into contact with the fixing member has a plate spring shape.

* * * * *